United States Patent
Takai et al.

(10) Patent No.: US 8,027,553 B2
(45) Date of Patent: Sep. 27, 2011

(54) CONNECTED BODY AND OPTICAL TRANSCEIVER MODULE

(75) Inventors: Toshiaki Takai, Yokohama (JP); Naoki Matsushima, Yokohama (JP); Koki Hirano, Hitachinaka (JP); Hiroki Yasuda, Mito (JP)

(73) Assignee: Hitachi Cable, Ltd., Tokyo (JP)

( * ) Notice: Subject to any disclaimer, the term of this patent is extended or adjusted under 35 U.S.C. 154(b) by 603 days.

(21) Appl. No.: 11/834,065

(22) Filed: Aug. 6, 2007

(65) Prior Publication Data

US 2008/0310854 A1 Dec. 18, 2008

(30) Foreign Application Priority Data

Aug. 24, 2006 (JP) .................. 2006-227690

(51) Int. Cl.
G02B 6/36 (2006.01)
H01L 29/40 (2006.01)

(52) U.S. Cl. ............ 385/14; 385/88; 257/698; 257/780; 257/784; 438/108

(58) Field of Classification Search .................... 385/14, 385/88–94
See application file for complete search history.

(56) References Cited

U.S. PATENT DOCUMENTS 7,291,929 B2* 11/2007 Tanaka et al. ................. 257/784
7,526,152 B2* 4/2009 Asai et al. ........................ 385/14
2004/0235221 A1* 11/2004 Taguchi et al. ............... 438/108
2006/0067608 A1* 3/2006 Kobayashi et al. ............. 385/14

FOREIGN PATENT DOCUMENTS

| CN | 1198013 | 11/1998 |
| CN | 1326226 | 12/2001 |
| CN | 1761107 | 4/2006 |
| JP | 2003-298167 | 10/2003 |
| JP | 2004-158701 | 6/2004 |
| JP | 2005-164801 | 6/2005 |
| JP | 2006-091241 | 4/2006 |

OTHER PUBLICATIONS

Office Action issued in Japanese Patent Application No. 2006-227690 on Dec. 28, 2010.

* cited by examiner

*Primary Examiner* — Hemang Sanghavi
(74) *Attorney, Agent, or Firm* — Antonelli, Terry, Stout & Kraus, LLP.

(57) ABSTRACT

An optical element amounted structure includes an optical element having an electrode such as a bump formed on a surface thereof, and a substrate having an electrode that is joined to the optical element formed on the surface. The structure of the electrode of the substrate has a substantially ring configuration or a substantially ring configuration a part of which is notched, and the optical element and the substrate are joined to each other in a configuration where a joining material such as a bump is inserted into an opening portion.

9 Claims, 7 Drawing Sheets

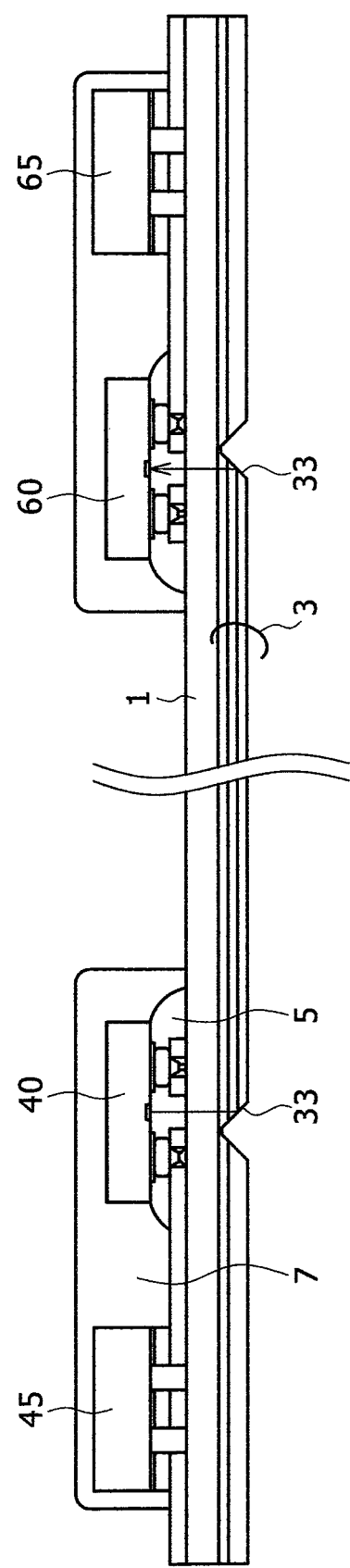

CONNECTED BODY AND OPTICAL TRANSCEIVER MODULE

CLAIM OF PRIORITY

The present application claims priority from Japanese patent application serial no. 2006-227690, filed on Aug. 24, 2006, the content of which is hereby incorporated by reference into this application.

BACKGROUND OF THE INVENTION

The present invention relates to a connected body and an optical transceiver module, and more particularly to a connected body and an optical transceiver module which are mounted by a face down bonding.

A recent high-speed transmission line starts the movement of applying optical fibers instead of electric wirings for the reasons that (1) the transmission line is wideband, (2) the transmission line is excellent in the electromagnetic wave noise resistance, and (3) the transmission line is small in the volume of fibers and light in weight. In the optical wiring, one of the most important factors is an optical coupling structure of an optical element such as a semiconductor laser or a photodiode with an optical transmission line such as an optical fiber or an optical waveguide. In order to obtain a high coupling efficiency, the optical element and the optical transmission line are required to provide the mounting precision of several tens μm in positioning even in the case of the multimode transmission. Also, after a reliability test of a temperature cycle or a high-temperature and high-humidity has been conducted on the optical element and the optical transmission line, no displacement or separation must occur. On the other hand, it is a basic premise that the optical wiring is inexpensive from the viewpoint of a substitute for the electric wiring. Therefore, the initial costs of material and a fabrication process must be suppressed as much as possible.

As a method of mounting the optical element which meets the above requirements, there is a method in which a surface receiving/emitting elements of a surface emitting laser (VCSEL: vertical cavity surface-emitting laser) and a surface illuminated type photodiode are mounted on a substrate by flip chip bonding, so as to be optically coupled with the optical transmission line that is located on a lower portion of the substrate, as disclosed in JP-A No. 2005-164801. With the above configuration, it is possible to form a joint structure of the optical element in the same process as that in the case of mounting the flip chip in the conventional electronic circuit.

Also, an annular electrode is formed on the light receiving/emitting portion to conduct flip chip bonding, as disclosed in JP-A No. 2003-298167. As a result, a loss due to the cross talk of the optical signal and the inflow of the underfill resin is prevented from increasing.

Further, JP-A No. 2006-091241 discloses a photoelectrical complex wiring component that enables information transmission which is excellent in noise tolerance, high in speed, and high in quality.

As a technique in which the optical element disclosed in JP-A No. 2006-091241 is mounted by face down, there are Au bump connection and solder connection. However, JP-A No. 2006-091241 fails to teach that there arise the following problems.

(1) In order to optically couple the optical element with the optical transmission line with high efficiency, it is essential that the parallelism between the optical element and the substrate can be precisely controlled. However, it is difficult to provide parallelization. More particularly, in the case where an Au bump is used for junction of the electrodes, a variation in the height of the bump leading end is extremely large. As a result, it is necessary to introduce a process for uniforming the heights of the respective bumps.

(2) The electrodes of the optical element is formed at intervals of several hundreds μm with about 100 μmφ, which is smaller than the electrodes of a general electronic circuit component. Accordingly, the supply quantity of joining material is small, and the control of the supply quality is difficult. For that reason, in the case where the joining material is excessively supplied, there arise problems such as an increase in the loss that is caused by the outflux of the joining material into the optical path at the time of mounting the optical element, or short-circuiting between electrodes.

(3) A distance between the optical element and the optical transmission line is an important factor for determining the optical coupling efficiency of the system. This distance is determined according to the joining material that joins the optical element and the optical transmission line. That is, the existence of the joining material increases the distance between the optical element and the optical transmission line. Also, the joining conditions and the variation of the supply quantity cause the optical output of the emitting element, and the deterioration and fluctuation of the sensitivity of the receiving element.

SUMMARY OF THE INVENTION

In order to solve the above object, the present invention devises the structure of the electrodes. More specifically, there is provided an optical module that connects an optical element having an electrode formed on a surface thereof, and a substrate having an electrode formed to be connected to the optical element on a surface thereof, wherein the electrode of the substrate has a recess in a region that is connected to the electrode of the optical element.

Also, according to the present invention, there is provided a connected body including: an optical element having a first electrode formed on one surface thereof; and a substrate having a second electrode formed on one surface thereof, the second electrode being connected to the first electrode of the optical element, wherein the second electrode has a recess, and is connected to the first electrode through a joining material.

Further, according to the present invention, there is provided an optical transceiver module including: a surface emitting element connected on one surface of a substrate; a surface receiving element connected on the one surface of a substrate; and an optical waveguide formed on another surface of the substrate, and optically connects the surface emitting element with the surface receiving element, wherein an electrode of the substrate which connects the surface emitting element with the surface receiving element has a recess, and connects the surface emitting element with the surface receiving element through a joining material.

BRIEF DESCRIPTION OF THE DRAWINGS

Preferred embodiments of the present invention will now be described in conjunction with the accompanying drawings, in which:

FIG. 3 is a diagram for explaining the cross section of an optical transceiver module;

DESCRIPTION OF THE PREFERRED EMBODIMENTS

Figure 1A:
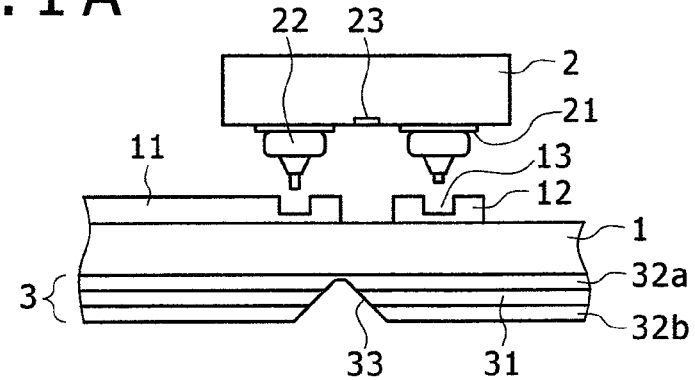
FIGS. 1A to 1D are diagrams for explaining the connection of an optical element and a substrate by use of an Au bump, respectively.

Hereinafter, a description will be given of the preferred embodiments of the present invention with reference to the accompanying drawings. In the description, the substantially same parts are denoted by like reference numerals, and their description will not be duplicated.

First Embodiment

Figure 1B:
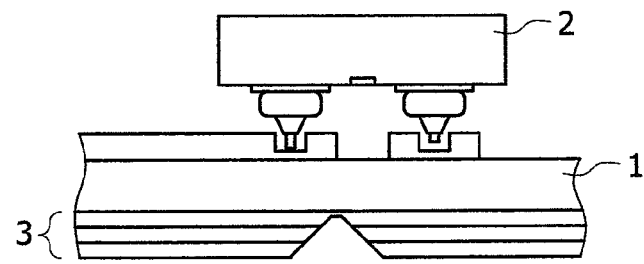
Figure 1C:
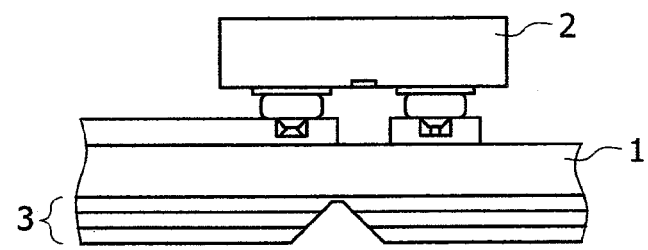
Figure 1D:
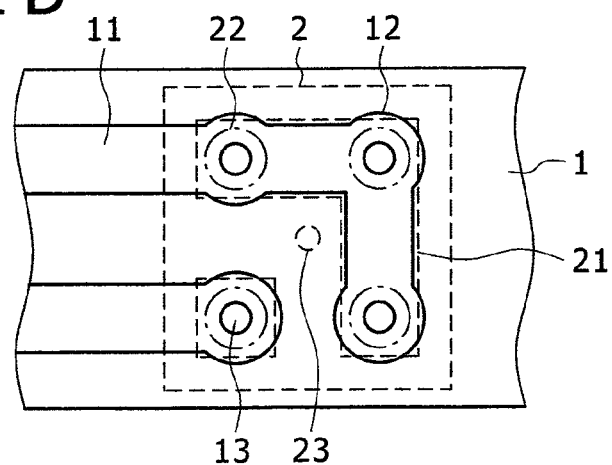
Figure 2A:
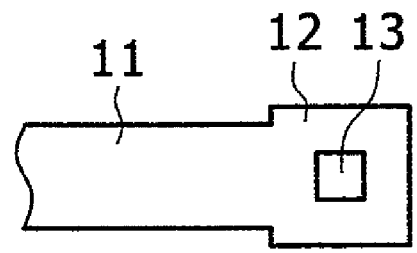
FIGS. 2A to 2C are plan views for explaining the connection portion of the substrate.
Figure 2B:
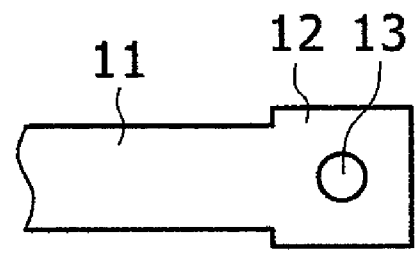
Figure 2C:
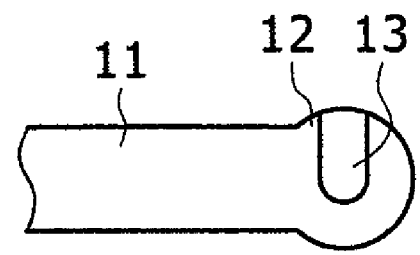

A first embodiment will be described with reference to FIGS. 1A to 3. FIGS. 1A to 1D are diagrams for explaining the connection of an optical element and a substrate by use of an Au bump, respectively. FIGS. 2A to 2C are plan views for explaining the connection portion of the substrate. FIG. 3 is a diagram for explaining the cross section of an optical transceiver module. FIGS. 1A to 1C are diagrams for explaining the cross sections, and FIG. 1D is a perspective plan view. In the drawings for explaining the cross sections, it would be obvious for those skilled in the conventional art that an upper surface and a lower surface of the substrate are not at the same cut position. In other words, referring to FIG. 1, the upper surface of the substrate is a first connection position, a light emitting point or a light receiving point of an optical element, and a development cross-sectional view of a second connection position. Portions other than the cross section are not shown, and hatching is omitted for simplification of the drawings. Also, the lower surface of the substrate is a cross section of waveguide portion immediately below the light emitting point or the light receiving point of the optical element. Those cross sections are identical with those in the following embodiments.

Referring to FIG. 1A, an electric wiring 11 and an electrode 12 that is connected to the electric wiring 11 are formed on a surface of a substrate 1. In the first embodiment, the substrate 1 is formed of a flexible substrate using a polyimide film. The members of the electric wiring 11 and the electrode 12 are structured by a rolled Cu 12 μm as a main material, on a surface of which Ni 2 to 5 μm and Au 0.3 μm are plated, in this example. The wiring material may be made of other materials, but it is desirable to meet items that are generally required as the electric wiring such that the wiring material is not high in the electric resistance, inexpensive, and easily machined as the conditions. The metalization of the surface depends on the joining system. In the first embodiment, because there is applied an Au—Au junction using the Au bump, Au is used for metalization. In the case of the Al bump, Al may be applied as the surface metalization.

The rear surface of the substrate 1 is equipped with an optical transmission line. In the first embodiment, there is formed an optical waveguide layer 3 including an optical waveguide core 31 made of a resin and optical waveguide clads 32a and 32b. The leading portion of the optical waveguide is formed with a 45° mirror 33 which is so designed as to guide an optical beam emitted from the top to the down on paper into an optical waveguide that is disposed in parallel from the left to the right on the paper when the optical element 2 is formed of an emitting element. Likewise, when the optical element 2 is formed of a receiving element, the mirror 33 reflects a light traveling from the right to the left on the paper so as to direct the light toward the top from the down on the paper, and guides the light to the optical element 2.

The electrode 12 of the substrate has a recess 13 formed in the vicinity of a center thereof and shaped in a ring. The recess is formed by etching after the wiring has been formed. The contour of the electrode 12 is toric (donut-shaped) viewed from the upper surface. Alternatively, the contour of the electrode 12 may be formed in a rectangle as shown in FIG. 2A. As shown in FIG. 2B, it is possible that the outer periphery of the electrode 12 is rectangular, and the recess 23 is circular. In addition, as shown in FIG. 2C, it is possible that the electrode 12 is configured such that a part of the ring contour is notched. The recess 13 may be formed by etching after Ni/Au (Ni→Au) plating has been conducted, or may be formed by conducting Ni/Au plating after the rolled Cu has been etched.

On the other hand, the electrode 21 of the optical element 2 is formed with a conductive bump 22 made of Au. The conductive bumps 22 are formed by cutting a wire after the first bonding of the wire bonding has been conducted. The conductive bumps 22 have a variation in the height of the respective bumps at the time of forming the conductive bumps 22. Accordingly, in the case where the conductive bumps 22 are located on a flat place, the optical element is very likely to be inclined with respect to the surface of the substrate. In the first embodiment, a positional relationship is satisfied such that the leading end of the conductive bump 22 is inserted into the recess 13 of the electrode 12 of the substrate 1. In other words, it is desirable that the diameter (width) of the recess 13 is larger than the diameter (width) of the leading end of the bump. In the case where the diameter of the bump leading end is 25 μm, the proper diameter of the recess 13 is about 40 to 70 μm. Also, it is preferable that the thickness of the bottom of the recess 13 is 1 to 2 μm, but it is not necessary as will be described in a second embodiment. In the case where Ni/Au plating is conducted after the rolled Cu has been etched, the thickness of the bottom is 3 to 6 μm, which is also acceptable.

FIG. 1B shows a state in which the conductive bump 22 that has been formed on the electrode 21 of the optical element 2 is inserted into the electrode recess 13. In this situation, a contact portion of the electrode 12 of the substrate with the conductive bump 22 is an end of the recess 13. When there is no recess, the electrode 12 comes in surface contact with the conductive bump 22, and the former is in contact with the latter at a circular line of the recess shown in FIG. 1. Since the contact area is reduced, even if a load on the optical element 2 is reduced, a satisfactory pressure is exerted on the contact portion with the result of which joining is securely conducted. In other words, because joining can be conducted by a small load, it is possible to prevent the optical element from being deteriorated by application of the load. Further, in the case where joining is conducted by use of ultrasonic joining, since an excellent connection can be realized even if the ultrasonic output is reduced, there can be obtained the advantage that the optical element 2 is prevented from being damaged as well.

FIG. 1C shows a state in which the optical element 2 and the substrate 1 are joined to each other. When those members are joined to each other by the ultrasonic joining, the conductive bump 22 is deformed, and Au—Au is diffused to join the conductive bump 22 and the electrode 12 of the substrate 1. In this situation, since the leading end of the conductive bump 22 is deformed within the recess 13, a variation in the height of the bump before joining is canceled. Also, the conductive bump 22 other than the leading end is also received in the recess. The quantity of bump that exists between the electrode of the optical element 2 and the top flat portion of the electrode 12 of the substrate 1 is reduced as compared with that in the conventional structure. Hence, a distance between the substrate 1 and the optical element 2 is reduced. That is, a distance between the optical waveguide core 31 formed on the substrate 1 and the optical element 2 is shortened, thereby increasing the optical coupling efficiency.

FIG. 1D shows a state in which the optical element 2 and the substrate 1 are joined together. In FIG. 1D, the optical element 2 is indicated by a broken line. The optical element 2 and the substrate 1 are mutually connected to each other at four points. A light emitting point or a light receiving point 23 is formed in the center of the optical element 2, and the mirror 33 and the optical waveguide 3 which are not shown are formed immediately below the light emitting point or the light receiving point 23.

The material of the substrate 1 is not limited to polyimide, but may be made of other transparent resins having a communication wavelength. In the present specification, the conductive bump may be called "joining material". The joining material includes a conductive bump, solder, and a conductive adhesive, but is not limited to those materials.

Referring to FIG. 3, on the wiring portion of an upper surface of the substrate 1 are mounted a VCSEL 40, a driver IC 45 that drives the VCSEL 40, a photodiode (PD) 60, and a preamplifier 65 that amplifies a fine signal from the PD 60 by low noise. Space surrounded by the VCSEL 40, the PD 60 and the substrate 1 is filled with an underfill resin 5 to relieve a stress exerted on the connection portion. The VCSEL 40, the driver IC 45, the PD 60, and the preamplifier IC 65 are coated with a sealing resin 7.

An optical waveguide 3 is disposed on a lower surface of the substrate 1, and the optical waveguide 3 is cut at an angle of 90° immediately below the light emitting point of the VCSEL 40 and immediately below the light receiving point of the PD 60 to form mirrors 33, respectively.

The driver IC 45 that has been input with an electric signal not shown modulates a laser beam of the VCSEL 40. The optical signal from the VCSEL 40 is coupled with the waveguide 3 by means of the mirror 33 that is located below the VCSEL 40. The optical signal is reflected by the mirror 33 that is located below the PD 60 and received by the PD 60. The PD 60 converts the optical signal into an electric signal, and amplifies the electric signal by means of the preamplifier IC 65. Since the substrate 1 and the waveguide 3 have flexibility, they can also be applied to a cellular phone of the clamshell type.

The structure shown in FIG. 3 is also applicable to other embodiments.

Second Embodiment

Figure 4A:
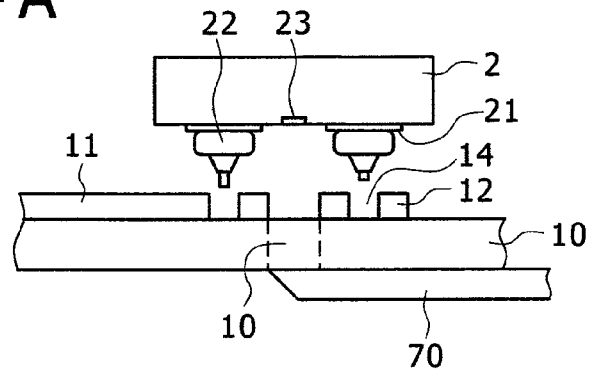
FIGS. 4A to 4D are diagrams for explaining the connection of the optical element and the substrate by use of the Au bump, respectively.
Figure 4B:
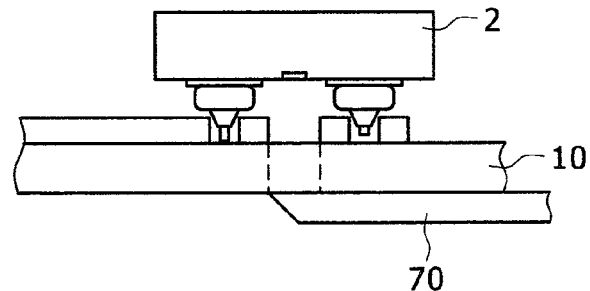
Figure 4C:
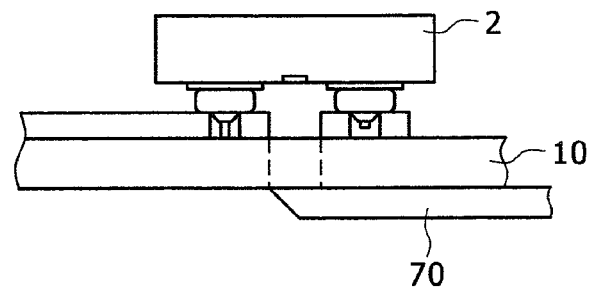
Figure 4D:
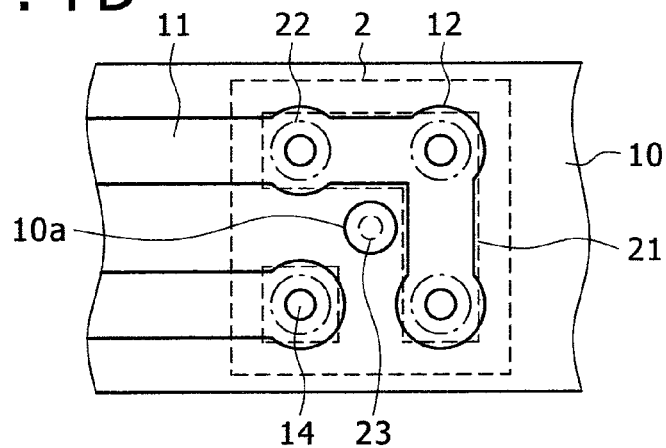

A second embodiment will be described with reference to FIGS. 4A to 4D. Here, FIGS. 4A to 4D are diagrams for explaining the connection of the optical element and the substrate using the Au bump. FIGS. 4A to 4C are diagrams for explaining the cross sections, and FIG. 4D is a perspective plan view thereof.

Referring to FIG. 4A, an opening portion 14 having no electrode member is defined in the vicinity of the center of the substrate electrode 12 on an upper surface of an RF-4 substrate 10 to form a substantial ring configuration. This structure is formed at the same time when the wiring and the electrode are patterned. Also, an opening portion 10a is defined in the substrate 10 that faces the light emitting point or the light receiving point of the optical element 2. An optical fiber 70 is adhered to the lower surface of the substrate 10, and an end surface of the optical fiber 70 is ground by 45°, and disposed immediately below the opening portion 10a. The configuration of the opening portion 14 is not limited to the substantially ring configuration, but may be formed in a rectangle as shown in FIG. 2A. Also, as shown in FIG. 2B, it is possible that the outer periphery of the electrode 12 is rectangular and the opening portion 14 is circular. Further, as shown in FIG. 2C, the opening portion 14 may be configured such that a part of the ring configuration is notched.

FIG. 4B shows a state in which the conductive bump 22 that is formed on the optical element 2 is inserted into the electrode opening portion 14 of the substrate. In the second embodiment, no electrode member exists in the electrode opening portion 14, thereby making it possible to absorb more variation in the height of the bumps than that in the first embodiment. As a result, there is advantageous in that the parallelism of the optical element 2 and the substrate 1 is ensured. Also, the length of the bump that can be inserted into the opening portion 14 is increased with the result that the distance between the substrate 10 and the optical element 2 can be shortened.

In the second embodiment, the printed board of FR-4 is used as the substrate 10, but the substrate 10 may be made of ceramic such as alumina, or formed of a flexible substrate using a polyimide film. Also, in the present specification, the opening portion is included in the recess. The optical fiber is an optical waveguide.

Third Embodiment

Figure 5A:
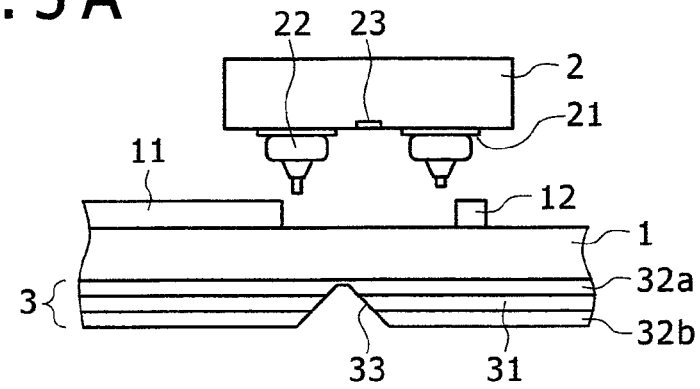
FIGS. 5A to 5D are diagrams for explaining the connection of the optical element and the substrate by use of the Au bump, respectively.
Figure 5B:
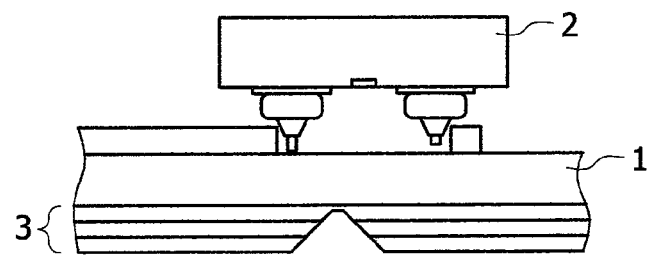
Figure 5C:
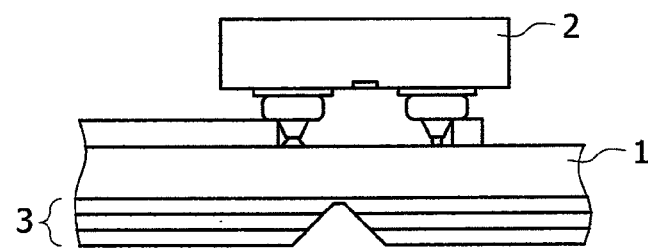
Figure 5D:
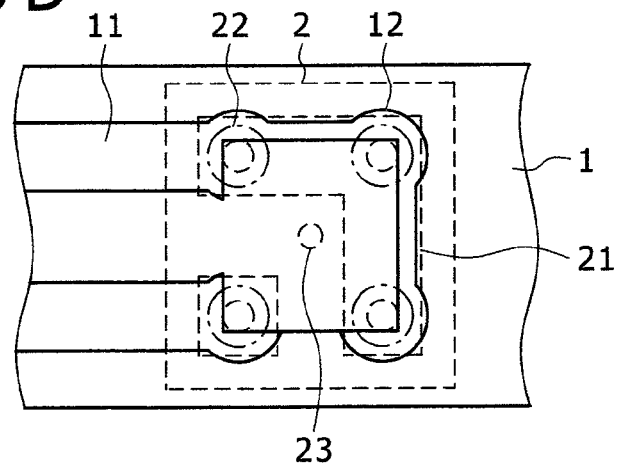

A third embodiment will be described with reference to FIGS. 5A to 5D. In this example, FIGS. 5A to 5D are diagrams for explaining the connection of the optical element and the substrate using the Au bump. FIGS. 5A to 5C are diagrams for explaining the cross sections, and FIG. 5D is a perspective plan view thereof.

Referring to FIG. 5D, the electrode 12 of the substrate 1 is configured such that the inside of a square centered on the light emitting point or the light receiving point 23 is deleted by etching. The electrode structure can be formed by etching together with the wiring 11.

As shown in FIG. 5A, the optical element 2 is formed with a conductive bump 22 made of Au. As shown in FIG. 5B, the optical element 2 is joined to the substrate 1 through ultrasonic joining in a state where the formed conductive bumps 22 are in contact with the substrate electrode end 12. In the third embodiment, the conductive bump 22 is in contact with only two sides of the substrate electrode 12. For that reason, a contact area of the conductive bump 22 with the substrate electrode 12 is reduced as compared with that in the second embodiment. That is, when the ultrasonic joining is conducted, even if a load that is exerted on the optical element 2 is further reduced, a sufficient pressure is applied to the contact portion. For that reason, the third embodiment is advantageous in that the damage of the optical element 2 is further prevented as compared with the second embodiment.

FIG. 5C shows a state in which the optical element 2 and the substrate 1 are joined together. In the third embodiment, the conductive bump 22 is in contact with the substrate electrode 12 at a side far from the light emitting point or the light receiving point 23 of the optical element 2. However, it is needless to say that the conductive bump 22 may be in contact with the substrate electrode 12 at a side close to the light emitting point or the light receiving point 23.

Fourth Embodiment

Figure 6A:
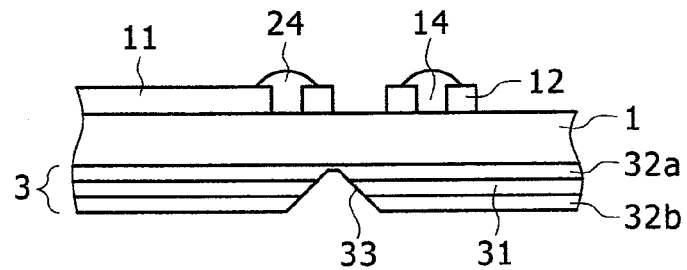
FIGS. 6A to 6D are diagrams for explaining the connection of the optical element and the substrate by use of a solder, respectively.
Figure 6B:
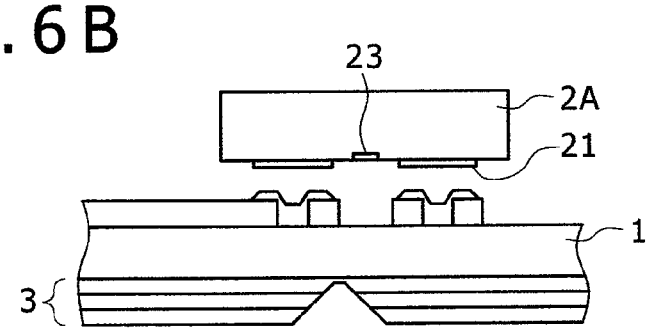
Figure 6C:
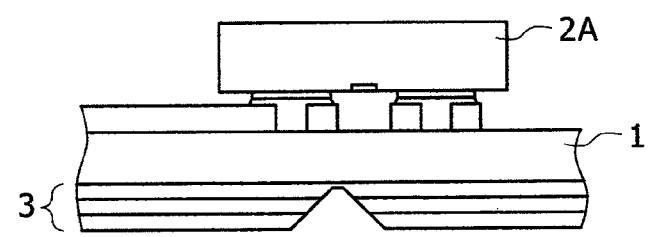
Figure 6D:
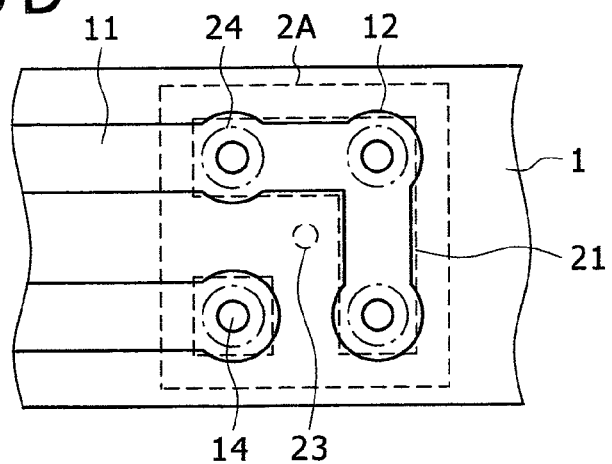

A fourth embodiment will be described with reference to FIGS. 6A to 6D. In this example, FIGS. 6A to 6D are diagrams for explaining the connection of the optical element and the substrate using the soldering. FIGS. 6A to 6C are diagrams for explaining the cross sections, and FIG. 6D is a perspective plan view thereof.

Referring to FIG. 6A, rolled Cu that has been formed on the polyimide substrate 1 constitutes the wiring 11, the hole portion 14 in the center thereof, and the electrode 12. The joining material 24 is supplied to the electrode 12 through a printing method. However, since the hole portion 14 is defined in the electrode 12, there is a case in which a space is formed under the joining material 24 that is supplied from above.

Referring to FIG. 6B, the interior of the hole portion 14 of the electrode 12 is filled with the joining material 24 due to vacuum deforming. In the fourth embodiment, Sn-1Ag-57Bi solder is used as the joining material 24. However, the solder material is not particularly limited, and may be made of an electrically conductive adhesive. However, the substrate 1 is made of polyimide, and the optical waveguide layer 3 that is made of a resin is formed on the rear surface of the substrate 1. In the case the substrate made of an organic material is thus used, when solder is used as the joining material, it is desirable to use a solder that is lower in melting point than an allowable temperature limit of the organic material such as In-3.5 Ag or Sn—Zn. Similarly, when the electrically conductive adhesive is used, it is desirable that a curing temperature is lower than the allowable temperature limit of the organic material.

As shown in FIGS. 6A and 6B, the joining material 24 is supplied to the hole portion 14 of the substrate electrode. As a result, it is possible to excessively supply the joining material as much as the volume of the hole portion 14, and it is easy to control the supply quantity when the joining material is supplied to a fine region. This is because when a variation in the supply quantity of the joining material is constant, the fluctuation rate due to a variation in the supply quantity is lower as the absolute quantity of the supply quantity is larger. Also, the surfaces of the substrate electrode 12 of the substrate 1 and the device electrode 21 of the optical element 2A are subjected to Au metalization in order to ensure the wetness of the solder material. In general, when Au is mixed in the solder material, intermetallic compounds are formed between Au and the solder material. The intermetallic compounds are formed on the boundaries between the substrate electrode 12 and device electrode 21, and the solder material 24. Because the intermetallic compounds are hard and low in the stress buffer effect, the reliability of the joining is lowered. However, in the fourth embodiment, because a large amount of solder exists, the ratio of mixture of Au formed on the electrode boundary into the solder material can be suppressed. For that reason, it is possible to prevent the solder connection reliability from being deteriorated by the excessive mixture of Au.

Similarly, in the fourth embodiment, the substrate electrode 12 may be configured such that a part of the ring configuration is notched as shown in FIG. 2C, as in the above embodiments. Also, it is desirable that the notched position of the ring is present at an opposite side of the light emitting point 23 (or the light receiving point) of the optical element 2 in order to avoid the optical path interfere due to the outflow of the solder material.

FIG. 6C shows a state in which the optical element 2 and the substrate 1 are joined together. The optical element 2 is mounted on the substrate 1 due to the adhesive, but because the adhesive accumulates in the recess 13, it is possible to thin the adhesive 24 between the electrode 21 of the optical element and the electrode 12 of the substrate. Also, even in the configuration where the ring configuration is partially notched, solder is extruded from the notch, to thereby thin the joining material of the joining portion. As a result, a distance between the substrate 1 and the optical element 2 is reduced, that is, the distance between the optical waveguide core 31 and the optical element 2 which are formed on the substrate is shortened, thereby increasing the optical coupling efficiency.

A solder flow stopper may be metalized in the lateral direction (horizontal direction) around the substrate electrode 12 and the device electrode 21. A method of supplying the joining material is not limited to printing, but may be cylinder supply or other methods.

Fifth Embodiment

Figure 7A:
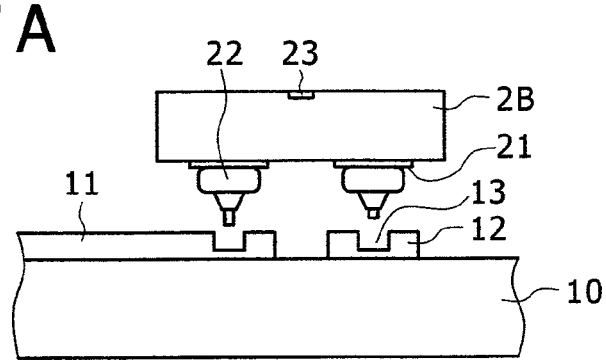
FIGS. 7A to 7D are diagrams for explaining the connection of the optical element and the substrate by use of the Au bump, respectively.
Figure 7B:
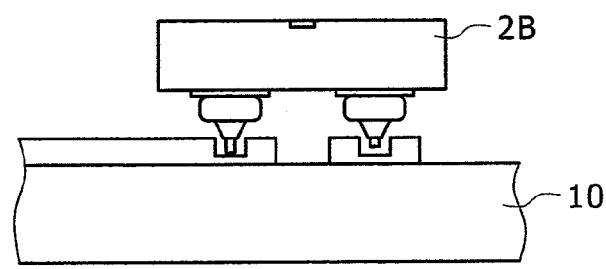
Figure 7C:
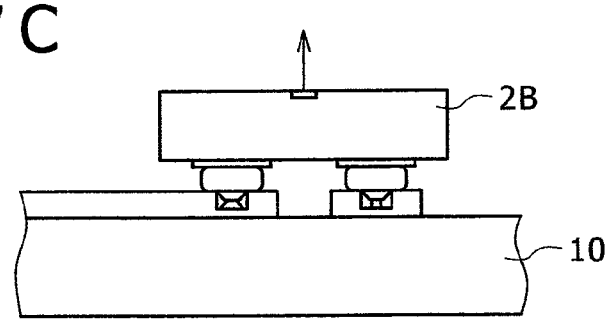
Figure 7D:
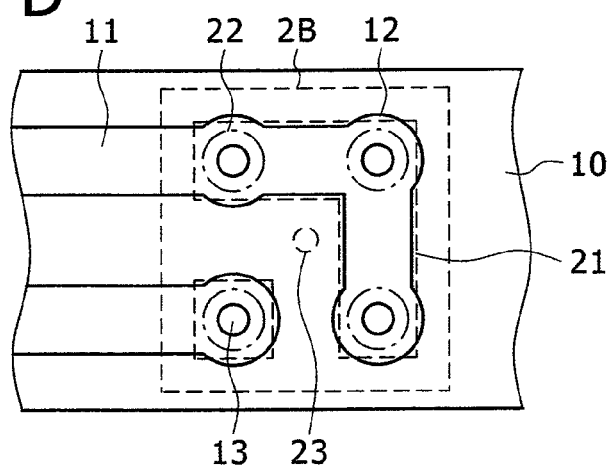

A fifth embodiment will be described with reference to FIGS. 7A to 7D. In this example, FIGS. 7A to 7D are diagrams for explaining the connection of the optical element and the substrate using the Au bump. FIGS. 7A to 7C are diagrams for explaining the cross sections, and FIG. 7D is a perspective plan view thereof. The joint structure according to the fifth embodiment is configured such that the optical element 2B of the rear surface emitting type is joined to the substrate in the joint structure of the first embodiment.

As shown in FIG. 7A, the fifth embodiment uses a surface emitting laser of the rear surface emitting type which exists on the rear surface of a surface (active surface) of the device element 21 on which the light emitting point 23 is formed as the optical element 2. The device electrode 21 is formed with a conductive bump 22 that is made of Au. As shown in FIGS. 7B and 7C, the conductive bump 22 is inserted into the recess 13, and the optical element 2 and the substrate 1 are joined to each other while the parallelism of the optical element 2 and the substrate 1 are more kept by use of the ultrasonic wave joint. As a result, the light that is output from the optical element 2B is output perpendicularly to the substrate 1. The light that is output from the optical element 2B is input to another optical system. Because the light is output perpendicular to the substrate 1, it is easy to position the substrate 1 with respect to the optical system.

In this embodiment, the printed board made of FR-4 is used as the substrate 10. However, it is needless to say that the member of the substrate 10 may be formed of a rigid substrate made of ceramic such as alumina, or a flexible substrate using a polyimide film. Also, the configuration of the recess 13 is not limited to the substantially ring configuration, but may be formed in a rectangle as shown in FIG. 2A. Further, as shown in FIG. 2B, it is possible that the outer periphery of the electrode 12 is rectangular, and the recess 13 is circular. In addition, as shown in FIG. 2C, a part of the ring configuration may be notched. Further, the optical element may be formed of a receiving element of the rear surface receiving type.

According to the above-mentioned first to fifth embodiments, the following advantages can be expected. In the case of the bumps whose joining material is Au, (1) The parallelism between the optical element and the substrate can be ensured without conducting a process of uniforming the height of the bumps.

(2) Because the bumps and the electrode of the substrate are not in surface contact with each other but in line contact with each other, even if a load at the time of joining is small, high pressure is exerted on the joint portion, thereby enabling the excellent joining property. In other words, it is possible to prevent a risk that the optical element is deteriorated by exerting a large load on the joint portion.

(3) Because the redundancy Au of the Au bumps enters the opening portion or the recess in the center of the electrode of the substrate, it is possible to reduce the bumps that exist in the flat portions of the electrode of the optical element and the electrode of the substrate as much as possible. As a result, the optical coupling efficiency is improved.

In the case where a solder paste or an electrically conductive adhesive paste is used as the joining material, (1) The paste material is supplied to the opening portion or the recess, thereby enabling more of the joining material solder than that in the conventional art to be supplied. As a result, it is easy to control the supply quantity of paste.

(2) Because the paste can be prevented from flowing out of the electrode, it is possible to prevent a defect such as short-circuiting from occurring.

(3) Because the joining material is accumulated in the opening portion, it is possible to thin the adhesive agent between the electrode of the optical element and the electrode of the substrate. As a result, the optical coupling efficiency is improved.

(4) In the case of soldering, because there exists a larger quantity of solder than that in the conventional art, it is possible to suppress the mixture ratio of Au formed on the electrode surface at the time of solder joining. This makes it possible to prevent the reliability of solder from being deteriorated by the mixture of excessive Au.

According to the present invention, it is possible to reduce the height of the optical element mounted on the substrate and a variation in the height.

We claims:

1. A connected body comprising:
an optical element having first electrodes formed on one surface thereof; and
a substrate having second electrodes formed on one surface thereof, the second electrodes being connected to the first electrodes of the optical element,
wherein the second electrodes have recesses, and are connected to the first electrodes through joint materials,
wherein the recesses are formed on the second electrodes by etching,
wherein the joint materials are conductive bumps,
wherein the conductive bumps include a leading end and a body,
wherein a first diameter of the recess is larger than a second diameter of the leading end of the conductive bump,
wherein a third diameter of the body of the conductive bump is larger than the first diameter of the recess,
wherein the leading ends of the conductive bumps are inserted into the recesses of the second electrodes and have spaces in vertical directions to an insertion direction within the recesses, and
wherein the bodies of the conductive bumps are contacted with the second electrodes and the conductive bumps are connected to the second electrodes.

2. The connected body according to claim 1,
wherein the optical element includes one of a surface emitting element and a surface receiving element.

3. An optical transceiver module comprising:
a surface emitting element connected on one surface of a substrate;
a surface receiving element connected on the one surface of the substrate; and
an optical waveguide that is formed on the other surface of the substrate, and optically connects the surface emitting element with the surface receiving element,
wherein electrodes of the substrate that connects the surface emitting element and the surface receiving element have recesses, and connect the surface emitting element and the surface receiving element through joining materials,
wherein the recesses are formed on the second electrodes by etching,
wherein the joint materials are conductive bumps,
wherein the conductive bumps include a leading end and a body,
wherein a first diameter of the recess is larger than a second diameter of the leading end of the conductive bump,
wherein a third diameter of the body of the conductive bump is larger than the first diameter of the recess,
wherein the leading ends of the conductive bumps are inserted into the recesses of the second electrodes and have spaces in vertical directions to an insertion direction within the recesses, and
wherein the bodies of the conductive bumps are contacted with the second electrodes and the conductive bumps are connected to the second electrodes.

4. The optical transceiver module according to claim 3, further comprising:
a driver that drives the surface emitting element which is mounted on the one surface of the substrate; and
an output signal amplifier of the surface receiving element which is mounted on the one surface of the substrate.

5. The optical transceiver module according to claims 3, wherein said substrate is flexible.

6. The optical transceiver module according to claims 4, wherein said substrate is flexible.

7. A connected body made by a method comprising:
providing an optical element having first electrodes formed on one surface thereof; and
forming a substrate having second electrodes on one surface thereof, the second electrodes being connected to the first electrodes of the optical element,
connecting the second electrodes that have recesses to the first electrodes through joint materials;
wherein the recesses are formed on the second electrodes by etching,
wherein the joint materials are conductive bumps,
wherein the conductive bumps include a leading end and a body,
wherein a first diameter of the recess is larger than a second diameter of the leading end of the conductive bump,
wherein a third diameter of the body of the conductive bump is larger than the first diameter of the recess,
inserting the leading ends of the conductive bumps into the recesses of the second electrodes, and
joining the bodies of the conductive bumps with the second electrodes and connecting the conductive bumps to the second electrodes.

8. The method of claim 7, wherein the bumps have various heights before joining the recesses of the second electrodes.

9. The method of claim 7, wherein the leading ends of the conductive bumps are deformed within the recesses of the second electrodes, so that the variation in the height of the bumps after joining the recesses of the second electrodes are canceled.

* * * * *